United States Patent [19]
Holloway

[11] Patent Number: 5,936,433
[45] Date of Patent: Aug. 10, 1999

[54] COMPARATOR INCLUDING A TRANSCONDUCTING INVERTER BIASED TO OPERATE IN SUBTHRESHOLD

[75] Inventor: Peter R. Holloway, Andover, Mass.

[73] Assignee: National Semiconductor Corporation, Santa Clara, Calif.

[21] Appl. No.: 09/012,802

[22] Filed: Jan. 23, 1998

[51] Int. Cl.$^6$ .................................................. H03K 5/153
[52] U.S. Cl. ................................. 327/75; 327/74; 327/77
[58] Field of Search ................................. 327/69, 71, 74, 327/75, 70, 77, 87, 88, 89, 337, 554, 538, 540, 545, 546

[56] References Cited

U.S. PATENT DOCUMENTS

| | | | |
|---|---|---|---|
| 4,612,461 | 9/1986 | Sood | 307/475 |
| 4,894,620 | 1/1990 | Nagaraj | 327/337 |
| 5,467,306 | 11/1995 | Kaya et al. | 365/185.2 |
| 5,528,184 | 6/1996 | Gola et al. | 327/198 |
| 5,689,206 | 11/1997 | Schaller | 327/337 |
| 5,774,014 | 6/1998 | Stecker et al. | 327/546 |
| 5,801,576 | 9/1998 | Ooishi | 327/530 |

*Primary Examiner*—Toan Tran
*Attorney, Agent, or Firm*—Limbach & Limbach L.L.P.

[57] ABSTRACT

A comparator including one or more transconducting inverters, each inverter biased to operate in a subthreshold state so as to have a desired high transconductance. In preferred embodiments, the transconducting inverter is biased in subthreshold by a bias voltage whose value is independent of process and environmental variations (so that the subthreshold current density in the inverter remains fixed despite supply voltage variations and other process and environmental variations). The bias voltage is generated by servoing an unregulated supply voltage so that the bias voltage has lower magnitude (relative to ground potential) than the supply voltage. The reduced-magnitude, regulated bias voltage precisely regulates at least one transistor in each inverter by forcing a constant current density therein, thereby causing the cell to operate in subthreshold. Due to the process-independent nature of the closed loop servo system inherent in the bias voltage generation circuitry, the bias voltage can be reliably generated with a precise, desired value which forces subthreshold operation of each inverter, and this precise bias voltage can be reliably distributed to multiple inverter. Also within the scope of the invention are analog-to-digital conversion circuits, each including a slave cell implemented as a CMOS inverter and biased in accordance with the invention, and switching circuitry implemented with CMOS technology (or with NMOS transistors but without PMOS transistors).

4 Claims, 4 Drawing Sheets

COMPARATOR INCLUDING A TRANSCONDUCTING INVERTER BIASED TO OPERATE IN SUBTHRESHOLD

BACKGROUND OF THE INVENTION

1. Field of the Invention

The present invention relates generally to methods and circuits for biasing one or more transconducting cells to operate in a subthreshold state so as to have a desired high transconductance, and to systems including one or more transconducting cells biased in accordance with the invention to operate in subthreshold. More specifically, the invention relates to methods and circuits for biasing at least one transconducting cell to operate in subthreshold by setting the current density for at least one transistor of each cell such that the current density remains fixed (at a level at which the transistor operates in or near subthreshold) despite significant supply voltage variations, and to systems including at least one so-biased transconducting cell.

2. Description of the Related Art

Throughout the disclosure, including in the claims, the term "transconductance" (denoted by the symbol "$g_m$") denotes the change in channel current of a transistor, in response to a change in gate-to-source voltage $V_{GS}$ (for a MOSFET transistor) or in response to a change in base-to-emitter voltage $V_{BE}$ (for a bipolar transistor). Throughout the disclosure, including in the claims, the term "transconducting cell" denotes a circuit that comprises one or more transistors, is characterized by a transconductance (determined by the transconductance of each of said one or more transistors and, if there are more than one of said one or more transistors, by the manner in which said transistors are connected together), is operable in or near a subthreshold state in which the transconductance has a desired value, and has an output voltage determined by an input voltage. Typically, the invention is employed to bias an "inverting" transconducting cell whose output voltage decreases in response to increasing input voltage (and whose output voltage increases in response to decreasing input voltage).

A metal-oxide-semiconductor field-effect transistor ("MOSFET" or "MOS" transistor) has a "gate" terminal which capacitively modulates the conductance of a surface channel which joins two end contacts, known as a source and a drain. The gate is separated from a semiconductor body which underlies the gate by a thin gate insulator. This gate insulator is usually composed of silicon dioxide. The channel is formed at the interface between the semiconductor body and the gate insulator.

Although there are devices known as depletionmode (normally on) MOSFETs, the term MOSFET is usually used to denote an enhancement-mode (normally off) device. The latter device is normally off because the body forms p-n junctions with both the source and the drain, so that no majority-carrier current can flow between the source and drain. Instead, minority-carrier current can flow, but only if minority carriers are available. For gate biases that are sufficiently attractive (i.e., above a threshold voltage), minority carriers are drawn into a surface channel, forming a conducting path from source to drain. Threshold voltage is often defined as the gate-to-source voltage $V_{GS}=V_{th}$ at which the channel begins to form (a more precise definition of threshold voltage will be discussed below with reference to FIG. 5). The gate and channel form two sides of a capacitor separated by the gate insulator. As additional attractive charges are placed on the gate side, the channel side of the capacitor draws a balancing charge of minority carriers from the source and the drain. With increasing charge on the gate, the channel is more populated, and the conductance increases. Because the gate creates the channel, to insure electrical continuity, the gate usually extends over the entire length of the separation between the source and the drain.

When the gate-to-source voltage of an N-channel MOSFET ("NMOS" transistor) rises to the threshold voltage $V_{th}$, the NMOS transistor begins to switch from off to on. When the gate-to-source voltage of a P-channel MOSFET ("PMOS" transistor) falls below the threshold voltage $v_{th}$, the PMOS transistor begins to switch from off to on. Above the threshold voltage, an NMOS transistor develops an excess of gate voltage beyond that required to "invert" the polarity of the carriers at the surface of the semiconductor. It is useful to think of this quantity, $V_{GS}-V_{th}$ as $V_{Gth}$, which has a "positive" value for an NMOS transistor and a corresponding "negative" value for a PMOS transistor.

The resulting NMOS (or PMOS) drain current than depends on both $V_{Gth}$ and the drain-to-source voltage, "$V_{ds}$". For an NMOS transistor, when $V_{ds} \ll V_{Gth}$ ("$-V_{ds} \ll -V_{Gth}$" for a PMOS transistor,) the device is said to operate in the "linear" region; and when $V_{ds} \geq V_{Gth}$ ("$-V_{ds} \geq -V_{Gth}$" for a PMOS transistor, the device is said to operate in the "saturation" region; and when $\alpha V_{Gth} \leq V_{ds} \leq V_{Gth}$ ("$-\alpha V_{Gth} \leq -V_{ds} \leq -V_{Gth}$" for a PMOS transistor,) where a is a constant less than one (typically 0.1–0.25), the device is said to operate in the "triode" region.

Additionally, above the threshold voltage, an NMOS transistor (below the threshold voltage, a PMOS transistor) exhibits drain current versus gate bias characteristics which are dependent upon whether the MOSFET is a long-channel device or is a short-channel device. For a long-channel device, the current in saturation increases proportionally to the square of the gate bias. For short channel devices, the drain current exhibits a somewhat more linear increase in saturation current with gate bias.

Notwithstanding the relationships defined herein between $V_{ds}$ and $V_{Gth}$, and the resulting three "drain-bias" operating regions relating these quantities, and, notwithstanding certain non-idealities associated with said short-channel effects, an NMOS transistor is said to be operating "in subthreshold" whenever the value of $V_{GS}$ results in a relationship between the surface potential, "$\phi_s$", and the built-in potential, "$\phi_b$", such that $\phi_b \geq \phi_s \geq -\phi_b$ ("$\phi_b \geq -\phi_s \geq -\phi_b$" for a PMOS transistor.)

Additionally, within this range for $\phi_s$, for either an NMOS or PMOS transistor, when $\phi_s = \phi_b$, the semiconductor surface is neutral, i.e. neither accumulated nor depleted, and $V_{GS}$ is equal to the so-called flat-band voltage, "$V_{FB}$"; and when $\phi_s = -\phi_b$, the semiconductor surface is at the onset of so called strong inversion and $V_{Gth} = 0$ (because of aforesaid definition of $V_{th}$); and when $|\phi_b| \geq -|\phi_b|$, the semiconductor surface goes from partial depletion through intrinsic and into weak inversion before attaining strong inversion.

Within said subthreshold region, the number of carriers in the channel is so small that their charge does not significantly affect the channel potential, and the channel carriers simply adapt to the potential set up between drain and source and to the space charge caused by depleted dopant ions in the channel.

When the mobile carriers are less numerous than the dopant ions, they are known as "minority" carriers. When the mobile carriers are more numerous than the dopant ions (which occurs for the first time at the strong inversion threshold, $V_{Gth}=0$,) they become known as "majority" carriers. In either case, the carriers remain of the same nature (electrons for NMOS devices and holes for PMOS devices) and contribute to current flow by drift and diffusion mechanisms. The practice of designating the carriers as minority and majority serve the purpose of segregating the relationship of channel-charge to gate bias, "$Q_{ch}(V_{GS})$", into two categories:

a subthreshold minority charge component, "$Q'_n$" for an NMOS device ("$Q'_p$" for a PMOS) which will subsequently be shown to vary exponentially with $V_{GS}$; and, a strong inversion majority charge component, "$Q_n$" for an NMOS device, ("$Q_p$" for a PMOS device) which will subsequently be shown to vary linearly with $V_{Gth}$ and, therefor $V_{GS}$. Thus, $Q_{ch}(V_{GS})=Q'_n+Q_n$ for an NMOS device and $Q_{ch}(V_{GS})=Q'_p+Q_p$ for a PMOS device.

For long-channel devices operating within the linear, triode or saturation regions, it can be shown that:

the subthreshold charge can be approximated as $$Q_n = \frac{-kT}{2q}\sqrt{\frac{q\varepsilon_{si}Na}{\varphi_b}}\exp\left[\frac{q\left(V_{Gth}-\frac{V_d}{2}\right)}{kT}\right]$$

for NMOS devices and as $$Q_p = \frac{kT}{2q}\sqrt{\frac{q\varepsilon_{si}Nd}{\varphi_b}}\exp\left[\frac{-q\left(V_{Gth}-\frac{V_d}{2}\right)}{kT}\right]$$

for PMOS devices, where "k" is the so called Boltzmann constant, "q"" is the electronic charge, "Na" is the acceptor dopant concentration in the channel of the NMOS device, "Nd" is the donor dopant concentration in the channel of the PMOS device, "$\varepsilon_{si}$" is the permittivity of silicon, "$V_d$" is the drain-to-source voltage in the linear and triode regions but is limited to $V_d=V_{Gth}=$"$V_{ds-sat}$" in the saturation region; and, the strong inversion charge can be approximated as $$Q_n = -C'_{ox}WL\left(V_{Gth}-\frac{V_d}{2}\right)$$

for NMOS devices and as $$Q_p = -C'_{ox}WL\left(V_{Gth}-\frac{V_d}{2}\right)$$

for a PMOS devices, where "W" and "L" are the width and length of the channel, respectively, $C'_{ox}$ is the effective area gate capacitance, and "$V_d$" is the drain-to-source voltage in the linear and triode but is limited to $V_d=V_{Gth}=$"$V_{ds-sat}$" when operating in the saturation region where it is assumed that $V_{Gth}\geq 0$ for an NMOS device and $V_{Gth}\leq 0$ for a PMOS device.

It can be observed from the above expressions describing channel charge that the minority channel charge is exponentially dependant on $V_{GS}$ over all three drain-bias regions whereas the majority channel charge is only linearly dependant on $V_{Gth}$, and therefor $V_{GS}$, over all three drain-bias regions.

The drain current that results from the total charge in the channel is merely $$I_{ds}(V_{GS}) = \frac{Q_{ch}(V_{GS})}{\tau_{tr}},$$

where "$\tau_{tr}$" is the average time for a carrier to transit the channel. For an NMOS device, $\tau_{tr}=L^2/\mu_n V_d$, and, for a PMOS device, $\tau_{tr}=L^2/\mu_p V_d$, where "$\mu_n$" and "$\mu_p$" are the effective mobility for electrons and holes, respectively, and $I_{ds}$ can be restated as $$I_{ds}(V_{GS}) = \frac{Q_{ch}(V_{GS})V_d\mu_{n,p}}{L^2},$$

where "$\mu_{n,p}$" is $\mu_n$ for NMOS devices and $\mu_p$ for PMOS devices.

Because $I_{ds}$ is now proportional to $V_d$ for a fixed value of $Q_{ch}$, the effect of this factor, combined with the aforementioned dependance of both $Q'_n$ and $Q_n$ in NMOS devices (and $Q'_p$ and $Q_p$ in PMOS devices) on $V_d$, results in $I_{ds}$ having two components:

a minority carrier current component, "$I_{ds-minor}$", which is now proportional to $V_d\exp[q(V_{Gth}-V_d/2)/kT]$ in the linear and triode drain-bias regions and proportional to $V_{ds-sat}\exp[q(V_{Gth}-V_{ds-sat}/2)/kT]$ or, simplifying, $V_{Gth}\exp[q(V_{Gth})/2kT]$ in the saturation region; and a majority carrier current component, "$I_{ds-major}$", which is now proportional to $V_d(V_{Gth}-V_d/2)$ in the linear and triode drain-bias regions and proportional to $V_{ds-sat}(V_{Gth}-V_{ds-sat}/2)$ or, simplifying, $V_{Gth}^2/2$ in the saturation drain-bias region.

For short-channel devices, however, the source and drain are sufficiently close to each other to begin to share control of $V_{th}$. If this effect is too strong, a drain voltage dependence of the subthreshold characteristic, as well as the strong inversion characteristic, then occurs, which at least in switching applications, is undesirable because such condition increases the MOSFET off current and can cause a drain-bias dependent threshold voltage.

For a well-designed MOSFET $V_{th}$ does not depend significantly on the drain and the channel current characteristics remain substantially as described.

FIG. 5 is a graph of the square root of the channel current (i.e., the square root of the current "$I_{ds}$" at the transistor's drain) of a typical NMOS transistor whose drain and gate are connected together (and therefor operating in the saturation drain-bias region) plotted on the "y" axis, versus the gate-to-source voltage ("$V_{GS}$") plotted on the "x" axis. The graphed function is increasingly linear for values of $V_{GS}$ substantially above a minimum voltage (labeled "$V_{th}$" in FIG. 5), where the device is said to operate in "strong inversion." The threshold voltage of the device is often defined as the x-axis intercept of a tangent to the linear portion of the function. As shown in FIG. 5, such tangent intersects the x axis at the point labeled "$V_{threshold-extrapolated}$" which is defined to be the effective threshold voltage for the purpose of calculating "$I_{ds-major}$", the majority carrier component. At values of $V_{GS}$ below $V_{threshold-extrapolated}$, the device is said to be operating in "deep subthreshold" and $I_{ds-major}$ is typically negligible compared to $I_{ds-minor}$. It is apparent from FIG. 5 that, in subthreshold, $V_{GS}$ can either be below $V_{threshold-extrapolated}$ (which is also equal to $V_{FB}+2\Phi_b$,) but above $V_{FB}$, or, $V_{GS}$ can be equal to or slightly above $V_{threshold-extrapolated}$, by as much as 100 mV or more.

For a typical NMOS transistor (whether or not its drain and gate are connected together), the logarithm of the channel current will be substantially proportional to the gate-to-source voltage $V_{GS}$, for values of $V_{GS}$ above $V_{threshold-extrapolated}$ but below a transition voltage ("$V_{strong-inversion}$" in FIG. 5). $V_{strong-inversion}$ is defined as ($V_{threshold-extrapolated}+\approx 100$ mV) At such values of $V_{GS}$, the device is said to be operating in "near subthreshold." The logarithm of the channel current for said device when operating with a gate-to-source voltage greater than $V_{FB}$ but less than $V_{threshold-extrapolated}$ will be exponentially proportional to $V_{GS}$ and the device is said to be operating in "deep subthreshold."

As defined above, the "transconductance" of a MOSFET transistor is the change in the channel current in response to a unit change in gate-to-source voltage $V_{GS}$. It is well known that the transconductance ($g_m$) of a transistor operating in subthreshold is typically very high. This desirable characteristic of subthreshold operation could be exploited in a wide variety of applications if subthreshold operation could reliably be maintained. Although it had been known that MOSFETs (and other transistors) can exhibit in subthreshold a high level of transconductance $g_m$, it had not been known how reliably to maintain a transconducting cell in subthreshold operation until the present invention.

SUMMARY OF THE INVENTION

The invention is a comparator (preferably of the type useful in an analog-to-digital converter) including one or more transconducting inverters, each inverter biased to operate in a subthreshold state so as to have a desired high transconductance. In preferred embodiments, the transconducting inverter is biased in subthreshold by a bias voltage whose value is independent of process and environmental variations (so that the subthreshold current density in the inverter remains fixed despite supply voltage variations and other process and environmental variations). The bias voltage is generated by servoing an unregulated supply voltage so that the bias voltage has lower magnitude (relative to ground potential) than the supply voltage. The reduced-magnitude, regulated bias voltage precisely regulates at least one transistor in each inverter by forcing a constant current density therein, thereby causing the cell to operate in subthreshold. Due to the process-independent nature of the closed loop servo system inherent in the bias voltage generation circuitry, the bias voltage can be reliably generated with a precise, desired value which forces subthreshold operation of each inverter, and this precise bias voltage can be reliably distributed to multiple inverter.

Also within the scope of the invention are analog-to-digital conversion circuits, each including a slave cell implemented as a CMOS inverter and biased in accordance with the invention, and switching circuitry implemented with CMOS technology (or with NMOS transistors but without PMOS transistors).

DETAILED DESCRIPTION OF THE PREFERRED EMBODIMENTS

Figure 1:
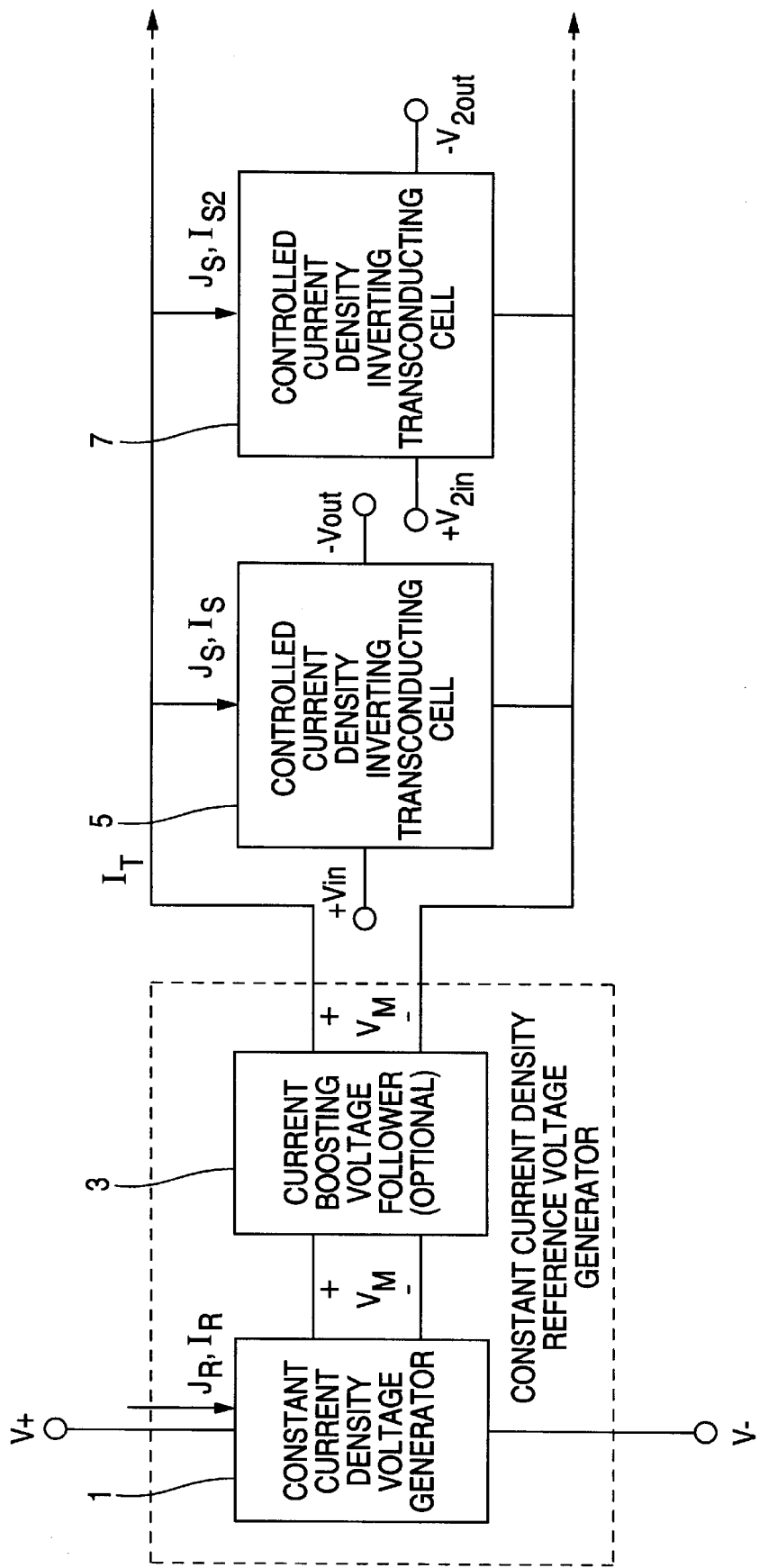
FIG. 1 is a block diagram of a preferred embodiment of the system of the invention.

FIG. 1 is a block diagram of a system including at least one slave cell biased in subthreshold in accordance with the invention. The FIG. 1 system includes constant current density voltage generator 1, inverting transconducting cells 5 and 7 (and optionally also additional inverting transconducting cells connected in parallel with cells 5 and 7), and current boosting voltage follower 3 connected between voltage generator 1 and each of the transconducting cells (including cells 5 and 7). Voltage generator 1 asserts regulated bias voltage $V_M$ in response to unregulated supply voltage (V+)−(V−)=Vdd. The supply voltage Vdd is typically supplied by a battery and is typically equal to about three or five volts. Also typically, the FIG. 1 circuit is implemented as an integrated circuit (or a portion of an integrated circuit) and the potential "V−" is ground potential for the integrated circuit. Current boosting voltage follower 3 receives bias voltage $V_M$ from generator 1, and asserts a bias voltage having the same magnitude ($V_M$) across each of cells 5 and 7 (and each other cell connected in parallel with cells 5 and 7).

Cell 5 draws current $I_s$, cell 7 draws current $I_{S2}$, and each other cell connected in parallel with cells 5 and 7 draws a current from voltage follower 3. Voltage follower 3 is configured to source the total current $I_T$ drawn by cells 5 and 7 (and each other cell connected in parallel therewith), and to assert the regulated bias voltage $V_M$ across each of the cells (including cells 5 and 7 even when a substantial total current $I_T$ is drawn from circuit 3 by all the cells.

When biased to operate in subthreshold by bias voltage $V_M$, cell 5 asserts output voltage −Vout in response to input voltage $V_{in}$ and cell 7 asserts output voltage −$V_{2out}$ in response to input voltage $V_{2in}$. When so biased in subthreshold, each cell's transconductance is high in the sense that there is a relatively large change in channel current of at least one transistor in the cell (in turn causing a relatively large change in the cell's output voltage) in response to a much smaller change in the cell's input voltage (which input voltage determines a gate-to-source voltage of at least one transistor operating in subthreshold in the cell).

Each of cells 5 and 7 is an inverting transconducting cell, and thus the negative signs of "−Vout" and "−$V_{2out}$" indicate that voltages −$V_{out}$ and $V_{in}$ have opposite sign (with respect to some reference voltage), voltages −$V_{2out}$ and $V_{2in}$ have opposite sign (with respect to some reference voltage), −$V_{out}$ decreases in response to increasing input voltage $V_{in}$ (and −$V_{out}$ increases in response to decreasing $V_{in}$), and −$V_{2out}$ decreases in response to increasing input voltage $V_{2in}$ (and −$V_{2out}$ increases in response to decreasing $V_{2in}$)

Each cell biased by generator 1 (e.g., cell 5 and cell 7) is sometimes denoted herein as a "slave" cell. Generator 1 is sometimes denoted herein as a "master" cell.

Generator 1 is designed so that bias voltage $V_M$ has a value that determines a desired (and preferably optimal)

power/noise/stability regime for each slave cell. In particular, each slave cell includes at least one transistor biased by voltage $V_M$ to operate in a subthreshold state so as to have high transconductance (and preferably to cause the slave cell to have high transconductance). For example, in the preferred embodiment of slave cell 5 shown in FIG. 2, the slave cell includes a CMOS inverter comprising PMOS transistor P2 and NMOS transistor N2, each of which transistors is biased by voltage $V_M$ to operate in a subthreshold state so that the inventor has high transconductance.

With reference again to FIG. 1, generator 1 provides regulation in the sense that voltage $V_M$ is constant despite significant variations in Vdd. Generator 1 preferably generates $V_M$ so as to bias the operating point of each slave cell to a subthreshold state which achieves optimum transconductance per unit current.

Generator 1 includes a transistor pair in which a constant current density $J_R$ is maintained. Each of slave cells 5 and 7 includes at least one transistor in which constant current density $J_R$ is replicated (the channel current density of such transistor is $J_S=J_R$). The circuit is implemented so that the value $J_S=J_R$ is sufficiently low (and the value of voltage $V_M$ is such) that each such slave cell transistor is biased to operate in subthreshold by regulated voltage $V_M$. By so replicating a constant current density in each slave cell, each slave cell of the FIG. 1 system draws (in repeatable and reliable fashion) a low, constant current through the channel of at least one transistor therein and each such transistors is reliably biased to operate in a subthreshold state.

Figure 2:
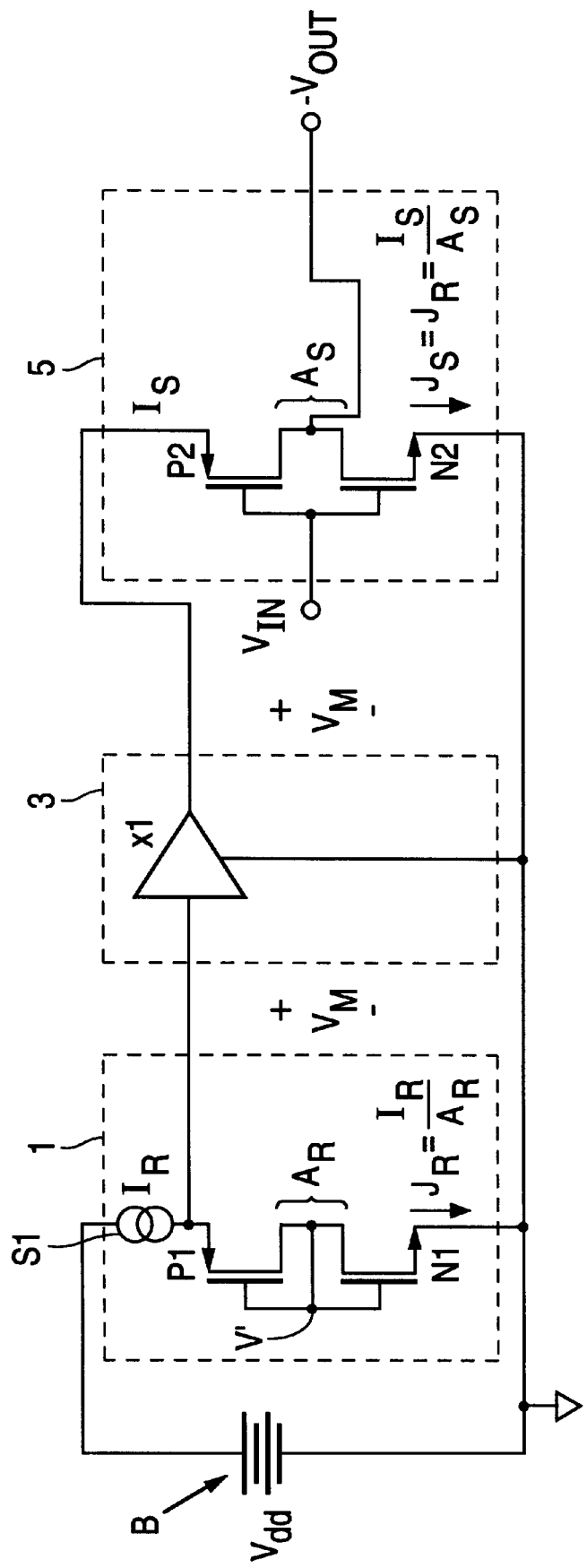
FIG. 2 is a schematic diagram of an implementation of a variation on the system of FIG. 1 which includes a single transconducting slave cell (circuit 5) implemented using CMOS technology.

For each slave cell transistor biased in subthreshold by voltage $V_M$, the channel current (e.g., $I_S$ or $I_{S2}$ in FIG. 1) is very low (e.g., 10 microAmps for the FIG. 2 embodiment of cell 5). Preferably, each such transistor is fabricated with a much larger channel width-to-length ratio (w/l ratio) than would be typical if the transistor were intended for normal, non-subthreshold operation. To replicate the (low) master cell channel current density ($J_R$) in such transistors in accordance with the invention with a typical channel current level in the slave cell, it is usually desirable that the transistors have large channel width-to-length ratios. The constant current density replicated in each slave cell that is biased to operate in subthreshold is $J_R=J_S=I_{Si}/A_{Si}$, where $I_{Si}$ is the channel current through the slave cell during subthreshold operation, $A_{Si}$ is the effective area (determined by the effective channel width-to-length ratio) of the transistor or set of transistors of the slave cell which operate in subthreshold, and "i" is an index identifying the slave cell. This constant current density is very low during subthreshold operation of the slave cell.

FIG. 2 is a schematic diagram of a preferred implementation of a variation on the system of FIG. 1 which includes only one slave cell 5, and which is implemented with CMOS devices. With reference to FIG. 2, battery B supplies voltage $V_{dd}$ across generator 1. Generator 1 comprises current source S1 (which is a source of fixed current $I_R$) connected in series with PMOS transistor P1 and NMOS transistor N1. Since it is well known how to design a source of fixed current $I_R$ that would be suitable for use in the FIG. 2 system, the details of such design are not discussed herein. The channels of transistors P1 and N1 are connected in series. In essence, transistors P1 and N1 comprise an inverter with its input shorted with its output. Each of transistors P1 and N1 is diode connected so that the common gates of P1 and N1 are connected to the common drains of P1 and N1, the source of P1 is connected to one terminal of current source S1, and the source of N1 is connected to ground. Battery B is connected between ground and the other terminal of current source S1 as shown.

Bias voltage $V_M$, asserted across current boosting voltage follower 3 by generator 1, is the sum of the gate-to-source voltages of transistors P1 and N1. The sum of these gate-to-source voltages includes the threshold voltages of devices P1 and N1 and the portion of each gate to source voltage which is in excess of (or less than) the threshold voltage.

The constant channel current density $J_R$ of transistors P1 and N1 is determined by the current $I_R$ from the current source, and the effective area $A_R$ of transistors P1 and N1, according to: $J_R=I_R/A_R$. The effective area $A_R$ is in turn determined by the effective channel width-to-length ratio of transistors P1 and N1. Preferably, each of transistors P1 and N1 is fabricated to have a much larger area than would be typical if it were intended for normal, non-subthreshold operation (preferably, the channel width of each is much greater than the typical width for non-subthreshold operation), so that there is a very low constant current density in each of transistors P1 and N1 during subthreshold operation. Similarly, each of transistors P2 and N2 in slave cell 5 is preferably fabricated to have a much larger area than would be typical if it were intended for normal, non-subthreshold operation, so that the constant current density replicated in each of transistors P2 and N2 during subthreshold operation of the slave cell is a very low current density.

In slave cell 5, PMOS transistor P2 and NMOS transistor N2 comprise a CMOS inverter. The input terminal for the cell is the common gates of P2 and N2. The source of P2 is connected to the output terminal of voltage follower 3 (and is thus held at bias voltage $V_M$ above ground), the drain of P2 is connected to the drain of N2, and the source of N2 is connected to ground. The common drains of N2 and P2 comprise the output terminal of cell 5. The common gates of P2 and N2 receive input voltage $V_{in}$, and the common drains of P2 and N2 are at output voltage $V_{out}$. Typically, circuitry (not shown) would be connected between the common gates of P2 and N2 (the inverter's input) and the common drains of P2 and N2 (the inverter's output), to provide feedback between the inverter's input and output. For example, slave cell 5 of FIG. 2 might implement an integrator comprising the CMOS inverter (shown in FIG. 2) and feedback circuitry (not shown) including a capacitor between the inverter's input and output.

Current boosting voltage follower 3 receives bias voltage $V_M$ from generator 1, and asserts a bias voltage having the same magnitude ($V_M$) across cell 5 to bias transistors P2 and N2 to operate in subthreshold. Cell 5 draws current $I_s$ from voltage follower 3, and transistors P2 and N2 have effective area $A_S$, such that the effective channel current density $J_s$ of transistors P2 and N2 replicates the effective channel current density $J_R$ of master cell 1: $I_S=J_SA_S=J_RA_S$.

In generator 1 (sometimes referred to as "master" cell 1), the drain voltage of transistors N1 and P1 is fixed by the diode connection (the drain to gate connection) for each device, so that $V_{DS}=V_{GS}$ for each device. The characteristics of transistors N1 and P1 (including their effective area $A_R$) and the value of $I_R$ should be chosen to set $V_M$ to the desired level for causing slave cell transistors P2 and N2 to operate in subthreshold. Given a particular value of current $I_R$, the constant channel current density $J_R$ of devices P1 and N1 (which is replicated in transistors P2 and N2 of slave cell 5) is determined by the effective channel width-to-length ratio of devices P1 and N1. In a typical implementation, $V_M$ is 1.5 volts (where the threshold voltage of each of slave cell transistors P2 and N2 is 0.7 volts). Thus, slave cell transistor P2 is biased by voltage $V_M$ to operate in subthreshold with a $V_{GS}$ of 0.75 volts and slave cell transistor N2 is also biased by voltage $V_M$ to operate in subthreshold with a $V_{GS}$ of 0.75 volts. More typically (because of differences between transistors P2 and N2), transistors P2 and N2 are not exactly symmetrical and the voltage $V_{IN}$ is not exactly $V_M/2$.

If, for slave cell 5 (or any other slave cell connected to the output of voltage follower 3 in parallel with cell 5), input voltage $V_{IN}$ is floating and output voltage $-V_{OUT}$ is within the range resulting from normal subthreshold operation of slave cell transistors P2 and N2 (i.e., assuming that the output voltage $-V_{OUT}$ is not at a level which would starve the drain of N2 or P2), then the input voltage $V_{IN}$ will always be equal to the voltage V' at the equivalent node (the common gates of P1 and N1) in master cell 1. The explanation for this is as follows. One condition for use of slave cell 5 (where there is no static DC load current at the output of cell 5, which will typically be the case) is that the drain currents of PMOS device P2 and NMOS device N2 are equal. When that is true, since the sum of the gate-to-source voltages ($VGS_{P2}$ and $VGS_{N2}$) of transistors P2 and N2 is $V_M$, it follows that voltage $V_{IN}$ at the input of cell 5 is equal to voltage V' at the equivalent node of master cell 1.

In the usual case that the input voltage $V_{IN}$ of slave cell 5 is driven, cell 5 operates as a high-gain comparator if there is no feedback between cell 5's output terminal and input terminal. In this case its transfer function would ideally be as follows: cell 5's output voltage $-V_{OUT}$ would go to $V_M$ in response to input voltage $V_{IN}$ less than V' (where V' is the voltage at the common gates of master cell transistors N1 and P1), and output voltage $-V_{OUT}$ would go to ground in response to input voltage $V_{IN}$ greater than V'. With real (non-ideal) implementations of the circuit, the transfer function would have finite gain in the transition region (the region in which voltage $V_{IN}$ is near to V').

If there is a feedback circuit connected between the output and the input of cell 5 so that cell 5 implements a function determined by the feedback circuit (e.g., that of a fixed-gain amplifier or other amplifier, or an integrator), then as long as such function is not overdriven, the input voltage $V_{IN}$ will strive to be equal to voltage V' (the voltage at the common gates of master cell 1) in the idealized case. With real (non-ideal) implementations of the circuit in which the transfer function of slave cell 5 has finite gain, when the slave cell's output voltage $-V_{OUT}$ changes away from the existing value of input voltage $V_{IN}$ on the input terminal, the cell's available gain with feedback forces voltage $V_{IN}$ on the input terminal to remain close to V' (so that the cell together with the feedback circuit remains in an operating region having a desired high gain, and the transistors within the cell remain in the subthreshold state).

In typical implementations, slave cell 5 of FIG. 2 has a gain in the range from fifty to several hundred. In embodiments of the invention that include a cascoded implementation of a transconducting slave cell, the slave cell can be implemented to have voltage gain as high as 100,000 or even higher.

In one contemplated application, a feedback circuit connected between the input and output of slave cell 5 includes a capacitor and a reset switch connected across the capacitor, to implement an integrator function. When the reset switch is open, any of the signal currents entering into the cell's input terminal would cause the voltage across the feedback capacitor to change, and therefore the voltage at the cell's output terminal would vary accordingly within the dynamic range of the cell. Other functions that can be implemented with different feedback circuits include fixed gain amplifiers, comparators, and level translators. In all cases, the slave cell is reliably biased in subthreshold in accordance with the invention, and the combined feedback circuit and slave cell thus operates with high gain, with its output voltage within the linear range of the slave cell's transfer function. Accordingly, the transconductance and voltage gain of the combined feedback circuit and slave cell is optimal.

The main feature of subthreshold operation of each transconducting slave cell in accordance with the invention is that the cell's transconductance can be substantially higher than is achievable if the cell operates other than in subthreshold, so that everything that the transconductance affects (e.g., bandwidth) is improved. The current density in each slave cell transistor operating in subthreshold is very small.

In each transconducting slave cell of each embodiment of the inventive system implemented with CMOS technology (e.g., the FIG. 2 system), the gate-to-source voltages required for subthreshold operation must be accurately set in order to accurately bias the two transistors of a CMOS inverter in the cell to their correct current level for subthreshold operation. The bias voltage $V_M$ generated in the master cell produces exactly the slave cell gate-to-source voltages which achieve the desired low-current, subthreshold slave cell operation. When the gate-to-source voltage of either slave cell transistor is varied in the vicinity of its extrapolated threshold voltage (e.g., within a hundred millivolts of the extrapolated threshold voltage), the transistor's sensitivity to the variation in the gate-to-source voltage is extreme. So, the very property that results in large change in channel current for small change in gate-to-source voltage (i.e., transconductance), requires extremely accurate control of the bias voltage $V_M$ (the value of $V_M$ is the sum of the gate-to-source voltages of the two transistors of the slave cell CMOS inverter). An important reason why the invention represents a significant advance over the prior art is that it provides such extremely accurate control.

The bias voltage Vm generated by master cell 1 of FIG. 2 can be thought of as the sum of four voltages: $V_M = V_{tn} + V_{gtn} + V_{tp} + V_{gtp}$, where $V_{tn}$ is the threshold voltage of NMOS device N1, $V_{gtn}$ is the "turnon voltage", of device N1 (the part of the gate-to-source voltage in excess of the threshold), $V_{tp}$ is the threshold voltage of PMOS device P1, and $V_{gtp}$ is the "turnon voltage" of device P1. The two threshold terms ($V_{tn}$, $V_{tp}$) are not controlled during operation, and are instead a function of process and environment. One function of the inventive master cell is to insulate the variation in the slave cell channel current $I_s$ from variations in the threshold voltages of master cell transistors P1 and N1.

If the voltage sum ($V_{tn} + V_{gtn} + V_{tp} + V_{gtp} = V_M$) is too large, voltage $V_M$ will not bias any slave cell into subthreshold operation. For example, if voltage $V_M$ is five volts (in typical implementations of FIG. 2 in which each of thresholds $V_{tn}$ and $V_{tp}$ is about 0.7 volts), each of turnon voltages $V_{gtn}$ and $V_{gtp}$ is about 1.8 volts, which is too high for subthreshold operation. In contrast, in one example of operation of such an implementation of FIG. 2 (in which each of $V_{tn}$ and $V_{tp}$ is about 0.7 volts) in accordance with the invention, voltage $V_M$ is 1.5 volts and each of turnon voltages $V_{gtn}$ and $V_{gtp}$ in slave cell 5 is about 0.05 volts, and thus transistors N2 and P2 are in subthreshold. More generally, during operation of typical implementations of the FIG. 2 system in accordance with the invention, each of turnon voltages $V_{gm}$ and $V_{gP}$ will be in the range from about 0.01 volts to 0.1 volts. The invention allows assertion of an appropriate bias voltage $V_M$ and accurate replication of such bias voltage across each of one or more slave cells (independent of the threshold voltages of the transistors comprising the master cell and each slave cell, and independent of variations in supply voltage $V_{dd}$.

There are numerous contemplated alternative embodiments of, and variations on, the FIG. 2 system. Several of these will next be described.

A second CMOS inverter could be included in the slave cell in parallel with the inverter comprising transistors P2 and N2. In such a variation on slave cell 5 of FIG. 2, the cell would draw twice as much current from voltage follower 5 than does cell 5, but each of the four transistors in the two inverters of the slave cell would have the same current density as exists in the master cell transistors (e.g., transistors P1 and N1 of FIG. 2). Conversely, by reducing the effective channel width-to-length ratio of inverter P2,N2 of FIG. 2, the so-modified slave cell could operate at lower channel current (but each of the transistors in the slave cell inverters would have the same current density as in the master cell transistors).

More generally, while keeping current densities $J_R = J_S$ unchanged, the ratio of slave cell current $I_S$ to master cell current $I_R$ of the FIG. 2 circuit is easily changeable by fabricating the circuit with transistors N2 and P2 of different sizes (i.e., different effective channel width-to-length ratios). If one master cell biases multiple slave cells, which will often be the practice, there could be one slave cell with channel current $I_{S1} = I_R$, another slave cell with channel current $I_{S2} = I_R /2$, and so on.

In other variations on the FIG. 2 circuit, the master cell current density $J_R$ and the slave cell current density $J_S$ are substantially different (although both are constant, and the master cell current density determines the slave cell current density). To implement such variations, voltage follower circuit 3 would be replaced by circuitry which adds a constant offset voltage $V_o$ to the constant bias voltage $V_M$, so that the slave cell is biased to operate in subthreshold by voltage $V_o + V_M$ (rather than by voltage $V_M$ alone). Such circuitry could comprise a voltage source having an input coupled to the output of the master cell, and a unity gain voltage follower (identical to circuit 3 of FIG. 2) having an input coupled to the output of the voltage source. Depending on the value of the constant offset voltage $V_o$, slave cell current density $J_S$ could be greater than or less than master cell current density $J_R$. As the ratio at nominal conditions of $J_S$ to $J_R$ deviates far from unity (e.g., to $J_S/J_R = 10/1$ or 5/1), then the tracking of the slave and the master becomes less and less accurate, and more subject to process variation (although not to supply voltage variation). This sensitivity to process variation is expected to increase somewhat slowly with $V_o$, so that when $V_o$ is zero there is minimum sensitivity to process variation, and as long as $V_o$ remains less than some significant voltage (e.g., voltage V' at the common gates of the master cell inverter) there may be adequately low sensitivity to process variation for some applications.

Other variations on the systems of FIG. 2 and FIG. 1 omit a power-consuming unity gain current boosting voltage follower (e.g., they omit voltage follower 3 of FIGS. 1 and 2, which would typically need to be provided with some supply voltage). For example, where master cell channel current $I_R$ is quite large, and the sizing (effective channel width-to-length ratio) of the master cell transistors N1 and P1 is also quite large, and then the slave cell transistors could have substantially smaller channel width-to-length ratio so that their channel currents $I_{Si}$ would be a small fraction of IR. In this case, one could actually operate multiple slave cells at fractional currents (fractional values of IR) by omitting the voltage follower (e.g., omitting voltage follower 3) and replacing it with just a wire.

The efficiency of the slave cell of FIG. 1 or 2 (operating in subthreshold) is determined by a "figure of merit." For a single MOS transistor, a figure of merit $V_H$ is defined to be $I_S/g_m$ (where $g_m$ is the transconductance and $I_S$ is the channel current) which is approximately equal to $KT/q + (V_{gtp})/2$ when the transistor is in subthreshold operation (as well as when it is in strong inversion). The first term is derived from differentiating $I_{ds\text{-}minor}$, and the second term is derived from differentiating $I_{ds\text{-}major}$, with respect to $V_{GS}$. Thus, to improve the transconductance per unit current, one would minimize $V_H$ by minimizing $V_{gtp}$.

A similar "figure of merit" for the inventive slave cell of FIG. 2 (cell 5 operating in subthreshold) is $V_{Hic} = KT/2q + (V_{gtp} \# V_{gtn})/2$, where the symbol # is defined as follows: A # B denotes A is "in parallel with" B so that A # B = A*B/A+B = 1/[(1/A)+(1/B)]. The combined transconductances of the two transistors of the FIG. 2 slave cell result in an effective figure of merit better than that of each individual one of the transistors.

Just as a single transistor has a defined relationship of channel current and transconductance, the combined operation of the two devices in inverting slave cell 5 of FIG. 2 has its own such relationship. For operation of the FIG. 2 embodiment with the gate of each of transistors N2 and P2 at a turnon voltage of $V_{gtp} = V_{gtn} = 50$ mV (where $V_{gtn}$ is the turnon voltage for N2, and $V_{gtp}$ is the turnon voltage for P2) beyond the threshold voltage at typical temperature (such threshold voltage is typically 0.7 volts), the figure of merit $V_{Hic}$ is about 26 mV. Thus, at $I_S = 10$ microAmps, the FIG. 2 embodiment achieves a value of $1/g_m$ of 2600 Ohms (which is a very low impedance and high $g_m$ for such a small current, for any circuit). It is important to realize that cell 5 is a complete amplifier; not just a stage within a complete amplifier. In general, the turnon voltages $V_{gtn}$ and $V_{gtp}$ of typical implementations of the FIG. 2 system will be in the range from 25 mV (or less) to 100 mV and the corresponding figures of merit, $V_{Hic}$, achieved would range from about 19.25 mV to 38 mV. For a single MOS device operating at a $V_{gtn}$ or $V_{gtp}$ of 1.8 volts, $V_{Hic}$ would be about 0.926 volts. It is interesting to note that the best $V_{Hic}$ that a single bipolar transistor could achieve (at room temperature) is 26 mV.

Figure 3:
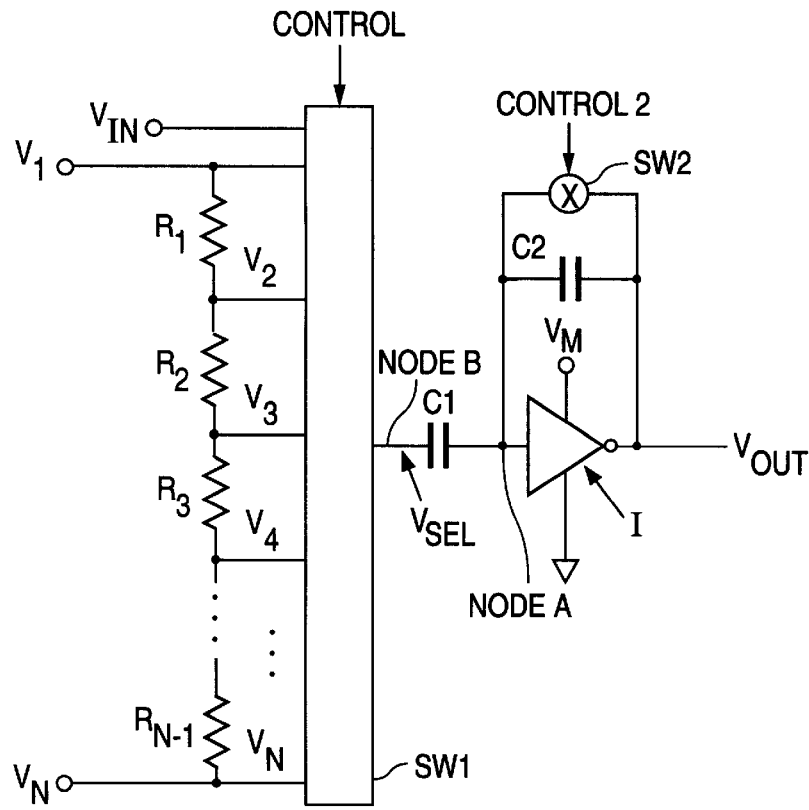
FIG. 3 is a schematic diagram of a comparator (of a type useful in an analog-to-digital converter), including a CMOS inverter designed in accordance with the invention.

An important application of the invention is as a comparator, e.g., a comparator used in an analog-to-digital (A-to-D) converter. It is known to implement an A-to-D converter in which each of several comparators compares an analog input voltage to each of a number of reference voltages. An example of a comparator that is conventionally used in such an A-to-D converter is a modified version of the FIG. 3 circuit, in which conventional inverter circuitry (biased by a conventional supply voltage $V_{dd}$) replaces the inventive inverter circuit I (which is biased to operate in subthreshold in accordance with the invention in response to subregulated bias voltage $V_M$). In accordance with the invention, such conventional inverter circuitry is replaced by inverter circuit I as shown in FIG. 3. Inverter circuit I is preferably a CMOS implementation of a transconducting, inverting slave cell biased in subthreshold in accordance with the invention (e.g., slave cell 5 of FIG. 2), which includes at least one PMOS transistor and at least one NMOS transistor, and is biased with subregulated bias voltage $V_M$ (generated by a master cell).

With reference to FIG. 3, analog input voltage $V_{in}$ and reference voltages $V_1, V_2, \ldots, V_N$ (where N is an integer greater than one) are supplied to switching circuitry SW1. Reference voltages $V_1$ and $V_N$ are the highest and lowest reference voltages, respectively, and are sometimes referred to as the "positive" and "negative" reference potentials. Reference voltages $V_2, V_3, \ldots, V_{N-1}$ are generated by applying reference voltage $V_1$ across a set of N−1 series-connected resistors $R_1, R_2, \ldots, R_{N-1}$ as shown (one end of the resistor ladder receives potential $V_1$ and the other end of the resistor ladder receives reference potential $V_N$). Switching circuitry SW1 selects any one of voltages $V_{in}$, $V_1$, $V_2, \ldots, V_N$ in response to one or more control signal(s) identified as "CONTROL" in FIG. 3. The voltage signal selected by circuitry SW1 (identified as "$V_{SEL}$") is asserted to Node B. Capacitor C1 is connected between the input of inverter I (Node A) and Node B.

The output of inverter I is connected through feedback capacitor C2 to the input of inverter I. Reset switch SW2 (connected across capacitor C2) is normally open, but can be closed (to reset the FIG. 3 system) in response to control signal CONTROL2.

Typically, switching circuitry SW1 includes N+1 switches, each of which is a transmission gate including both a PMOS transistor and an NMOS transistor, and switch SW2 is also a transmission gate including both a PMOS transistor and an NMOS transistor. Also typically, CONTROL is a set of N+1 signals, each indicative of a binary bit, and each asserted to a different one of the transmission gates within SW1. In a typical implementation, N=2, so that at any time, circuitry SW1 selects one of three input signals: $V_{in}$, $V_1$ which is used during a "coarse" comparison, and $V_2$ which is used during a "fine" comparison. The A-to-D converter would include several comparators of the type shown in FIG. 3, each for comparing the input voltage $V_{in}$ (sequentially) with a different pair of coarse and fine reference voltages.

In operation, the control signals (or signal) CONTROL typically cause (causes) circuitry SW1 to assert the following sequence of voltages $V_{in}, V_1, V_2, \ldots$, and $V_N$ to Node B (e.g., to capacitor C1): $V_{in}$ and then $V_1$ (to perform comparison of $V_{in}$ with $V_1$), then $V_{in}$ again followed by $V_2$ (to perform comparison of $V_{in}$ with $V_2$), and so on.

An important advantage of the FIG. 3 embodiment of the invention is that its critical operating parameters (e.g., noise and bandwidth) are not subject to significant variations, despite process and environmental variations (e.g., temperature variations or variations in the supply voltage employed to generate subregulated bias voltage $V_M$) that may occur during manufacture and/or operation of the system. In contrast, the critical operating parameters of a conventional comparator which employs a conventional inverter (biased by a conventional supply voltage to operate other than in subthreshold) are subject to significant variations in response to such process and environmental variations. Thus, the FIG. 3 embodiment of the invention can be designed to operate with optimal characteristics (including power, speed, and noise) with confidence that these characteristics will not vary significantly, despite process and environmental variations that may occur during manufacture and/or operation. The performance of a so-optimized implementation of the FIG. 3 circuit would exceed that of a conventional comparator including a conventional (and conventionally biased) inverter.

However, the FIG. 3 embodiment of the invention has limited operating speed (in the sense that it can operate as intended only if the selected voltage $V_{SEL}$ asserted to Node B varies sufficiently slowly). This limitation on maximum operating speed is due primarily to inclusion of both PMOS and NMOS transistors in the transmission gates (within switching circuitry SW1), since the capacitance of Node A (the input node of inverter I) is dominated by the parasitic capacitance of the transmission gates within circuitry SW1, and since the maximum speed depends on the RC time constant associated with Node A.

The inventors have recognized that the maximum operating speed could be increased if only NMOS transistors were used to implement the switching circuitry which selects the voltage $V_{SEL}$ that appears at Node B. The inventors have also recognized that with such an NMOS-only implementation of the switching circuitry, it would be necessary to modify the FIG. 3 design to allow the switching circuitry to operate effectively over a wide range of input voltages (i.e., over values of $V_{in}, V_1, V_2, \ldots$, and $V_N$ in the full range from ground potential to the system supply potential $V_{dd}$). The FIG. 4 embodiment of the invention is designed to achieve both increased maximum operating speed, and effective operation over a wide range of input voltages.

Figure 4:
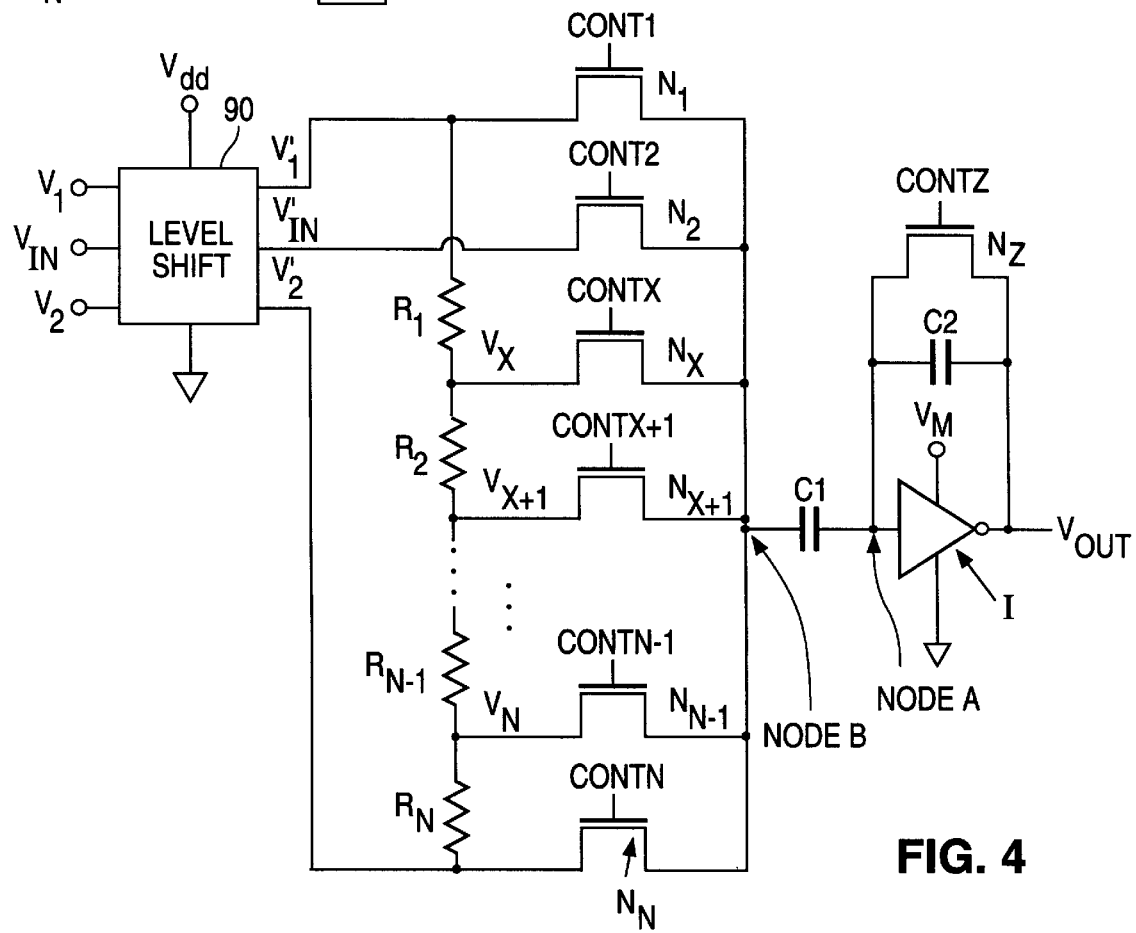
FIG. 4 is a schematic diagram of a comparator (of a type useful in an analog-to-digital converter), including an inverter (implemented with NMOS transistors but without PMOS transistors) designed in accordance with the invention.
Figure 5:
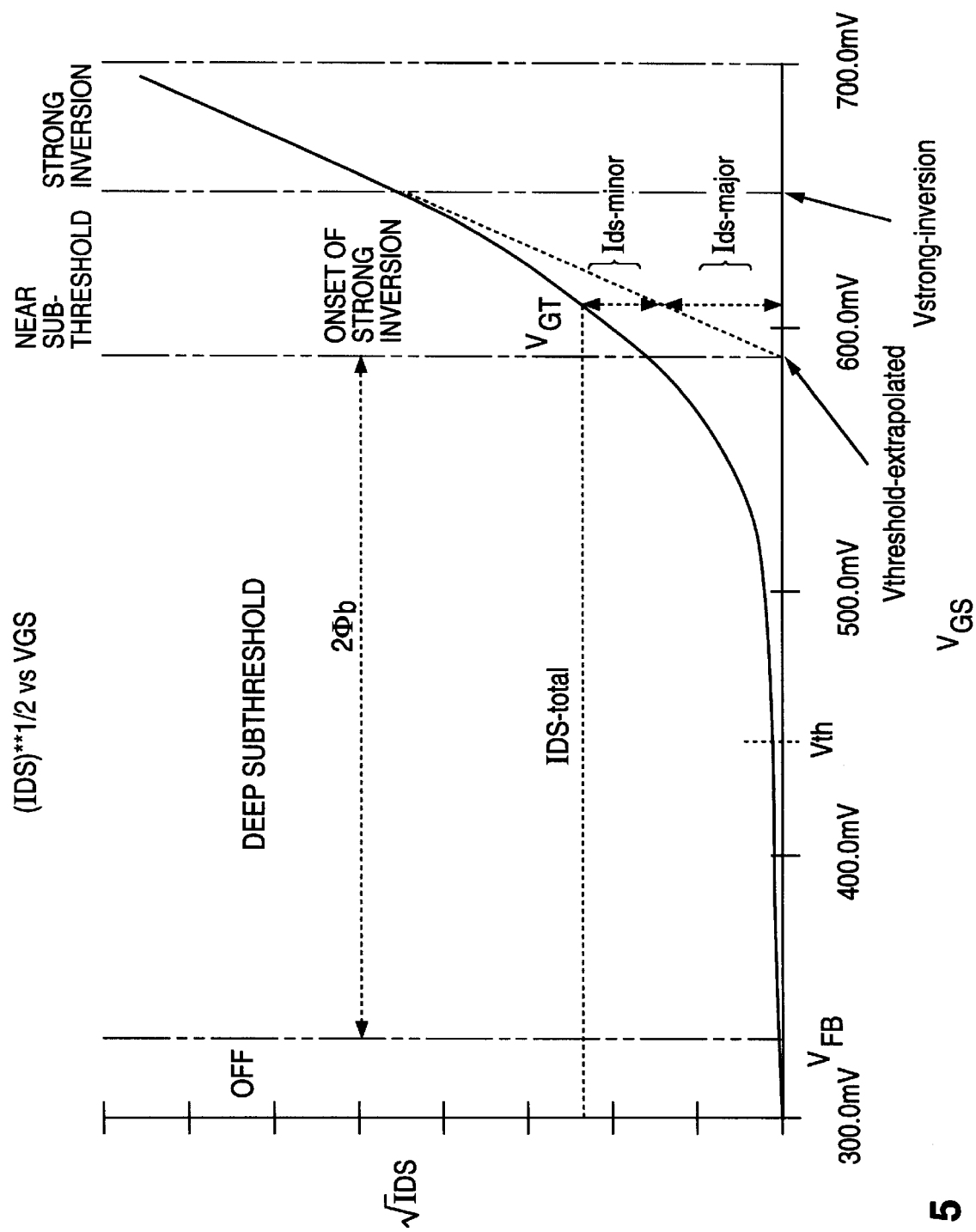
FIG. 5 is a graph representing the square root of drain current $I_d$ of an NMOS transistor whose drain and gate are connected together, as a function of gate-to-source voltage.

With reference to FIG. 4, the comparator of FIG. 4 differs from that of FIG. 3 in that the FIG. 4 comparator's switching circuitry is implemented using only NMOS transistors (rather than both PMOS and NMOS transistors as in FIG. 3). The function of the FIG. 4 circuit is to compare any of reference voltages $V_1$ and $V_2$ and input voltage $V_{in}$ (each received at level shifting circuit 90), and optionally also reference voltages $V_X, V_{X+1}, \ldots, V_N$ (where N is an integer greater than two) generated by resistor ladder $R_1, \ldots, R_N$, to any other one of these voltages. Of the reference voltages $V_1$ and $V_2$, voltage $V_1$ is greater than $V_2$, and thus $V_1$ and $V_2$ are sometimes referred to herein as the "positive" reference potential and "negative" reference potential, respectively. At any time, the value of input voltage $V_{in}$ can be greater or less than $V_1$, and/or greater or less than $V_2$ (but $V_{in}$ is always within the range from ground potential to supply potential $V_{dd}$).

Still with reference to FIG. 4, reference voltages $V_X$, $V_{X+1}, \ldots$, and $V_N$ are generated by applying level-shifted reference voltage $V'_1$–$V'_2$ across a set of N series-connected resistors $R_1, R_2, \ldots, R_N$ which define a resistor ladder as shown. One end of the resistor ladder receives potential $V'_1$ and the other end receives level reference potential $V'_2$. In variations on the FIG. 4 circuit, resistors $R_1, R_2, \ldots, R_N$ and NMOS transistors $N_X, N_{X+1}, \ldots, N_N$ are omitted, and a sequence of selected ones of $V'_1$, $V'_2$, and $V'_{in}$ only is asserted to Node B. It should be understood that the index "X" is an integer less than "N," "X" is greater than 2, index X is used only in implementations in which N is greater than 3, and that both of indices X and X+1 are used only in implementations in which N is greater than 4.

Level shifting circuit 90 generates shifted reference potential $V'_1$ by shifting the level of reference potential $V_1$ (which has any value in the full range from potential $V_2$ up to the system supply potential $V_{dd}$, where $V_{dd}$ is typically five volts above ground). Circuit 90 shifts each value of potential $V_1$ to a corresponding value (of potential $V'_1$) in the reduced range from potential $k_1 V_2$ to $k_2 V_1$, where $k_1$ is a constant greater than or equal to one, and $k_2$ is a constant less than or equal to one ($k_1$ and $k_2$ are not both equal to one). In one preferred implementation in which the maximum value of $V_1$ is $V_{dd}$=five volts, $k_2$ is chosen so that the maximum value of $k_2 V_1$ is 2.048 volts.

Circuit 90 also shifts each value of potential $V_2$ to a corresponding value (of the potential $V'_2$) in the reduced range from potential $k_3 V_2$ to $k_4 V_1$, where $k_3$ is a constant greater than or equal to one, and $k_4$ is a constant less than or equal to one ($k_3$ and $k_4$ are not both equal to one). The reduced ranges from $k_1 V_2$ to $k_2 V_1$ and from $k_3 V_2$ to $k_4 V_1$ are chosen so that each of NMOS switching transistors $N_1$ and $N_N$ operates effectively over all values of potentials $V'_1$ and $V'_2$ in the reduced ranges (given typical "high" and "low" values of the control signal CONT1 asserted to the gate of transistor $N_1$ and of the control signal CONTN asserted to the gate of transistor $N_N$). Given such reduced ranges of $V'_1$ and $V'_2$, each of NMOS switching transistors $N_X, N_{X+1}, \ldots, N_{N-1}$ operates effectively over all values of the potential ($V_X, V_{X+}, \ldots, V_{N-1}$) asserted to one end of its channel from the resistor ladder comprising resistors $R_1, R_2, \ldots, R_N$ (given typical "high" and "low" values of the control signal (CONTX, CONTX+1, . . . , CONTN-1) asserted to each such transistor's gate.

Circuit 90 also shifts each value of input potential $V_{in}$ (which is in the range from ground potential to supply potential $V_{dd}$) to a corresponding value (of the signal $V'_{in}$) in the reduced range from potential $k_5V_2$ to $k_6V_1$, where $k_5$ is a constant greater than or equal to one, and $k_6$ is a constant less than or equal to one ($k_5$ and $k_6$ are not both equal to one) The reduced range from $k_5V_2$ to $k_6V_1$ is chosen so that NMOS switching transistor $N_2$ operates effectively over all values of potential $V'_{in}$ in the reduced range (given typical "high" and "low" values of the control signal CONT2 asserted to the gate of transistor $N_2$).

The voltage level shifting implemented by circuit 90 is such that the potentials $V_{in}, V_1,$ and $V_2$ will always have the same relative levels as $V'_{in}, V'_1,$ and $V'_2$, respectively (in the sense that if $V_1>V_{in}>V_2$, then $V'_1>V'_{in}>V'_2$, and so on).

Each of NMOS transistors $N_1, N_2, \ldots, N_N$ functions as a switch to select one of voltages $V'_1, V'_{in}, V_X, V_{X+1}, \ldots, V_N$ in response to one of control signals CONT1, CONT2, . . . , CONTN. Each of the controls signals is indicative of a binary bit, and each is asserted to a different one of the gates of transistors $N_1$–$N_N$.

In a typical implementation N is equal to 3 (the resistors $R_1$–$R_N$ and transistors $N_X$–$N_{N-1}$ shown in FIG. 4 are omitted), and transistors $N_1, N_2,$ and $N_N$ are controlled to select sequences of the three input signals $V'_{in}, V'_1$ (which can be a reference potential asserted during a "coarse" comparison), and $V'_2$ (which can be a reference potential asserted during a "fine" comparison). At any instant, only one of the three input signals is selected. The A-to-D converter would typically include several comparators of the type shown in FIG. 4, each for comparing the input voltage $V'_{in}$ (sequentially) with a different pair of coarse and fine reference voltages.

Still with reference to FIG. 4, the voltage signal selected by transistors $N_1$–$N_n$ is asserted to Node B. Capacitor C1 is connected between the input of inverter I (Node A) and Node B. The output of inverter I is connected through feedback capacitor C2 to the input of inverter I. NMOS transistor $N_z$ (whose channel is connected across capacitor C2) functions as a reset switch which is normally open, but can be closed (to reset the FIG. 4 system) in response to control signal CONTZ.

In operation (in the case that N=3), the control signals CONT1, CONT2, and CONTN are typically asserted to cause transistors $N_1, N_2,$ and $N_3$ to assert the following sequence of potentials $V'_{in}, V'_1,$ and $V'_2$ to Node B: $V'_{in}$ and then $V'_1$ (to perform comparison of $V'_{in}$ with $V'_1$), then $V'_1$ in again followed by $V'_2$ (to perform comparison of $V'_{in}$ with $V'_2$), and so on.

Although only certain embodiments have been described in detail, those having ordinary skill in the art will certainly understand that many modifications are possible without departing from the teachings thereof. All such modifications are intended to be encompassed within the following claims.

What is claimed is:

1. A comparator, including:

a master cell configured to assert a regulated bias voltage in response to an unregulated supply voltage, wherein the bias voltage has a lower magnitude relative to ground than does the supply voltage;

switching circuitry having an output and multiple inputs, one of said inputs coupled to receive an input voltage and each other one of said inputs coupled to receive a different one of a set of reference voltages, said switching circuitry being configured to assert at the output any selected one of the input voltage and the reference voltages;

a transconducting slave cell coupled to receive the bias voltage and configured to operate in subthreshold in response to said bias voltage, wherein the slave cell comprises a transconducting inverter being biased by the bias voltage having an input coupled to a first node, and an output coupled to an output node of the slave cell, and wherein the slave cell also comprises a feedback capacitor connected between the first node and the output node, and a switch connected between the first node and the output node in parallel with the feedback capacitor, said switch being configured to discharge the feedback capacitor in response to a control signal; and a second capacitor connected between the output of the switching circuitry and the first node.

2. The comparator of claim 1, wherein the switching circuitry is implemented using NMOS transistors but without any PMOS transistor, said comparator also including:

a level shifting circuit coupled to receive a raw input voltage, a first raw reference voltage, and a second raw reference voltage, where the first raw reference voltage and the second raw reference voltage span a first range, and configured to generate said input voltage and said reference voltages in response to the raw input voltage, the first raw reference voltage, and the second raw reference voltage such that the reference voltages span a reduced range having magnitude less than the first range.

3. The comparator of claim 2, wherein the reduced range is such that each of the NMOS transistors of the switching circuitry operates effectively over all potentials in said reduced range.

4. The comparator of claim 1, wherein the master cell includes:

at least one transistor; and circuitry configured to maintain a constant current density in said at least one transistor, thereby causing said at least one transistor to assert said bias voltage in such a manner that said bias voltage remains at least substantially fixed despite variations in the unregulated supply voltage and other process and environmental variations, and wherein the transconducting inverter includes at least one slave cell transistor and is configured to replicate the constant current density in said at least one slave cell transistor when said transconducting inverter receives the bias voltage.

* * * * *